United States Patent

Thomason

[11] Patent Number: 6,012,140
[45] Date of Patent: Jan. 4, 2000

[54] PROCESSING SYSTEM, PROCESSING UNIT, MEMORY AND COMPILING METHOD

[75] Inventor: Graham G. Thomason, Redhill, United Kingdom

[73] Assignee: U.S. Philips Corporation, New York, N.Y.

[21] Appl. No.: 08/935,591

[22] Filed: Sep. 23, 1997

[30] Foreign Application Priority Data

Sep. 26, 1996 [EP] European Pat. Off. .............. 96202700

[51] Int. Cl.[7] ...................................................... G06F 9/30
[52] U.S. Cl. ......................... 712/226; 365/222; 711/104; 395/705
[58] Field of Search .............................. 395/750.03, 705; 365/222, 226–229; 711/106, 1, 104; 712/226, 227; 713/322, 320, 324

[56] References Cited

U.S. PATENT DOCUMENTS 5,469,559  11/1995  Parks et al. ............................. 711/106
5,602,999   2/1997  Hyatt ...................................... 711/1

OTHER PUBLICATIONS

Smith et al., "A New Approach For A Superconductive RAM Memory Design," IEEE, pp. 375–378a, 1990.
Hamacher et al., Computer Organization, McGraw Hill Pub. Co., pp. 322–329, 1990.

Primary Examiner—John A. Follansbee
Attorney, Agent, or Firm—Anne E. Barschall

[57] ABSTRACT

A processor contains a memory and a processing unit. The memory is of a type which loses data upon reading. The processing unit has instructions of a first type and of a second type, each of which, when executed, causes the processing unit to read the data from the memory. Instructions of the first type cause the processing unit to restore the data in the memory after reading, instructions of the second type cause the processing unit not to restore the data after reading. During compilation of a program, it is determined whether a generated instruction that reads data from the location is the last instruction to do so. If so, an instruction of the second type is generated. If not, an instruction of the first type is generated.

13 Claims, 2 Drawing Sheets

PROCESSING SYSTEM, PROCESSING UNIT, MEMORY AND COMPILING METHOD

BACKGROUND OF THE INVENTION

1. Field of the Invention

The invention relates to a processing system, a processing unit for such a processing system, a method of generating instructions for such a processing system and a compiler for generating instructions for such a processing system.

2. Related Art

A processing system also contains a processing unit which is able to execute instructions which cause the processing unit to load data from a memory. Conventionally, the memory may contain dynamic RAM memory (DRAM) or static RAM memory (SRAM), but it may also contain ferroelectric RAM (FRAM). DRAM and destructive FRAM are read-destructive memories: when data is read from DRAM and FRAM it is lost.

To enable a program executing on the processing system to read the data again form DRAM or FRAM as if the memory were an SRAM, the data needs to be restored by rewriting it into the memory location from which it was read. Restoring data reduces the time during which the memory is available for reading and it consumes power, in particular in FRAM. Restoring data may also reduce the life expectancy of the memory.

BRIEF SUMMARY OF THE INVENTION

Amongst others, it is an object of the invention to provide for a processing system, a processing unit for such a processing system, a method of generating instructions for such a processing system and a compiler for generating instructions for such a processing system which allow the costs expended in restoring data to be reduced.

The invention provides for a processing system comprising a memory having at least one memory location of a type which loses data upon reading, a processing unit having instructions of a first type and of a second type, each of which, when executed, causes the processing unit to read the data from the memory, instructions of the first type causing the processing unit to restore the data in the memory after reading, instructions of the second type causing the processing unit not to restore the data after reading.

The invention also provides for a method of generating instructions for executing operations of a program for a processing system with a memory with locations which lose data upon reading, and a processing unit having a first and a second type of instruction for reading data from the memory, the processing unit restoring and not restoring the data in the memory when executing instructions of the first and of the second type respectively, the method comprising the steps of determining whether an operation in the program reads data from a memory location, determining whether the operation can be followed by another operation reading data from that memory during execution of the program, generating an instruction of the first type when the operation can be followed by such another operation, and generating an instruction of the second type when the operation cannot be followed by such another operation.

The method according to the invention makes sure that during execution of the program fewer restore operations are needed, by generating a special type of instruction that omits the restoration of data when it is known from program structure that the data does not need to be read from memory again. This is the case for example if a memory location is used to store a certain program variable and a (sub-)program read of that variable is not followed by another read before the end of the (sub-)program, or at least not before a write to the variable occurs.

The processing system according to the invention makes it possible to execute programs wherein execution of the instructions that cause the processing system to read data from read destructive memory can be differentiated according to whether it is known from program structure whether the data is needed again.

The processing system according to the invention has an embodiment wherein each instruction type which causes the processing unit to read data from the memory location and restore the data in the memory has a counterpart instruction type which does not cause the processing unit to restore the data in the memory. Thus the possibility to choose between restoring data in memory and not restoring data is available for all types of instructions that read from memory and is not limited to special types of instructions (such as exclusively to LOAD instructions). The types of instructions which offer this choice may include instructions with a direct address and instructions with an register indirect address. They may also include instructions that only load registers and registers that perform some logic or arithmetic operation on the data loaded from memory.

DESCRIPTION OF THE DRAWINGS

These and other advantageous aspects of the invention will be exemplified using drawings.

DETAILED DESCRIPTION OF THE INVENTION

Figure 1:
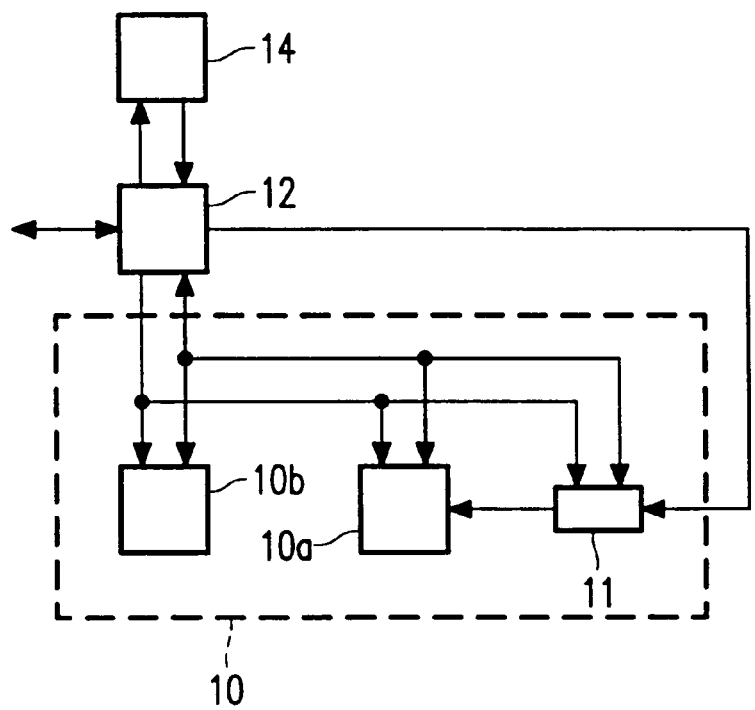
FIG. 1 shows a processing system.

FIG. 1 shows a processing system. The processing system contains a data memory 10, a processing unit 12 and an instruction memory 14. The data memory 10 contains a read destructive memory part 10a (for example an FRAM), a non read destructive part 10b and a restore circuit 11. The processing unit 12 is coupled to the data memory 10 via an address-bus, a data-bus and a restore signal line. The processing unit 12 is connected to the instruction memory 14 via an address bus and an instruction bus. Details of the processing system are given by way of example: without prejudice to the invention, the instruction memory 12 could be part of the data memory 10, using the address bus and data bus of that data memory 10. Furthermore, all of the data memory 10 may be read destructive, instead of just a part 10a.

In operation the processing unit 12 reads successive instructions from the instruction memory 14. After reading an instruction the processing unit 12 executes the instruction.

Figure 2:
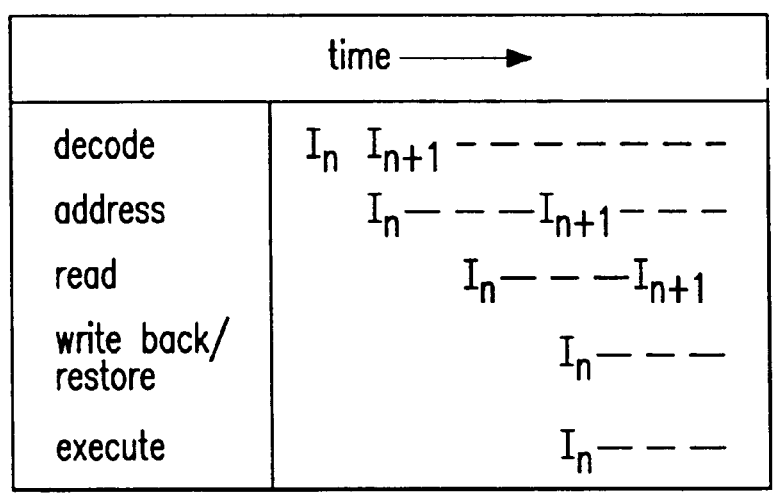
FIG. 2 shows a timing plan of an embodiment of execution of an instruction.

FIG. 2 shows a timing plan of an embodiment of execution of an instruction $I_n$. In this embodiment, the processing unit 12 handles the instruction $I_n$ in successive stages. In a first stage the processing unit 12 decodes the instruction $I_n$. If the processing unit 12 finds that the instruction involves reading data from data memory 10, the processing unit 12 derives an address from the instruction $I_n$ and issues this address in a second stage of instruction execution. In response to the address, the data memory 10 reads the data from the memory location addressed by the address and presents this data to the processing unit 12 via the data-bus. In a third stage of instruction execution the processing unit 12 reads the data from the data-bus. In a fourth stage of instruction execution the processing unit 12 executes whatever function is implied by the instruction; for example, the processing unit 12 loads the data in a register or adds data to the contents of a register.

When the data has been read from a part 10a of the data memory 10 that contains read destructive memory cells, for example ferroelectric RAM cells, and the data has to be read again from the data memory 10, the data needs to be restored in the data memory 10. Restoration of the data can start during the fourth stage of instruction execution when the processing unit 12 executes whatever function is implied by the instruction. Restoration can be implemented by writing back the data to the addressed memory location via the databus, but preferably restoration is implemented internally in the data memory 10, that is, without the need to transfer the data back via the bus, using restore circuits that are well known per se for example for DRAMs and FRAMs. During restoration, the part of the data-memory 10 that is being restored cannot be read. This may cause delays if another access to the data memory 10 is needed, for example during execution of a next instruction $I_{n+1}$ after the reading instruction $I_n$ which may occur in pipelined fashion (i.e. decoding of the next instruction $I_{n+1}$ may start as the memory is addressed in the second stage of execution of the instruction $I_n$ and the processing unit may be ready to read data for the next instruction $I_{n+1}$ when the instruction $I_n$ is executing). Moreover, restoration means that the processing system consumes extra power. In addition some memory cells can only be written a limited number of times before failure is to be expected. Therefore restoration of the data may reduce the life expectancy of the memory.

According to the invention restoration is executed only if the processing unit 12 signals, under direction of the instruction, that restoration is needed. In case the read destructive memory 10a is implemented on an integrated circuit separate from the processing unit 12, this integrated circuit preferably contains a restore enable input coupled to a restore enable output of the processing unit 12, the memory 10a containing a restore circuit that is activated only if the processor issues a restore enable signal to the restore enable input. Restoration may also be achieved by writing back the data from the processing unit 12 to the data memory 10 via the data-bus.

Read and restore may be executed blockwise, for example by reading one row(=block) of data from a matrix memory and restoring that row. In this case the block may be kept in a temporary memory (like a cache) for reading various data items from the block without further reading of the block from memory. If the block is to be restored only the instruction that causes the block to be read from the matrix needs to indicate that the block should be restored.

Figure 3:
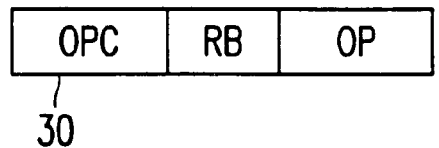
FIG. 3 shows an embodiment of an instruction format.

FIG. 3 shows an embodiment of instruction format that allows the processing unit 12 to signal whether restoration of data is needed. The instruction 30 contains an opcode OPC, an operand OP and a restore bit RB. The restore bit need only be present in instructions that involve reading data from data memory 10. Preferably, these instructions can be used to read from all of the data memory 10, that is both form the read destructive part 10a and the non-read destructive part 10b. Also preferably all instructions with opcodes OPC that imply reading contain a restore bit RB, but the restore bit may also be limited to some opcodes. Instead of using a separate restore bit, different opcodes may be used to indicate different versions of the same instruction which respectively do and do not involve restoration. As an alternative, all opcodes may contain a restore bit RB, the restore bit RB having no effect in the execution of those opcodes OPC that do not involve reading from memory.

Figure 4:
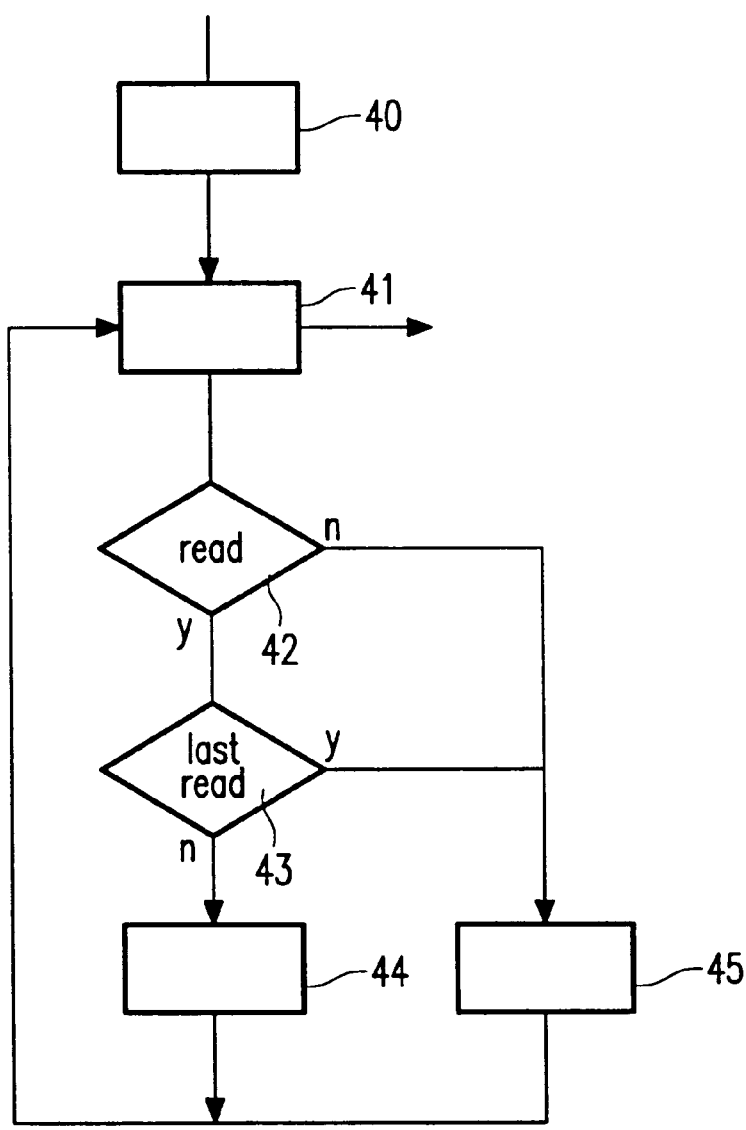
FIG. 4 shows a flowchart for generating instructions.

FIG. 4 shows a flowchart for generating instructions for storage in the instruction memory 14. In a first step 40 of the flowchart a source program is received that specifies the operations that have to be generated for execution. In the first step 40 memory locations are allocated to variables of the source program and the source program is translated into a list of preliminary instructions. The second step 41 of the flowchart controls a loop of steps 42, 43, 44, 45. The second step causes the loop to be executed once for each particular preliminary instruction in the list, until the loop has been executed for all preliminary instructions in the list.

In a first step 42 of the loop it is determined whether the particular preliminary instruction involves reading data from a read-destructive memory location. If not, a second step 45 of the loop is executed in which a physical or virtual machine instruction is generated which corresponds to the particular preliminary instruction and which signals that no restoration of data is needed when the machine instruction is executed. When the particular preliminary instruction does involve reading from a read destructive memory location, a third step 43 of the loop is executed which test whether data can be read from that location during execution of the (sub-)program after execution of the particular preliminary instruction and before the end of execution of the (sub-) program or before any other data is written into that location. If not the second step 45 of the loop is executed, if data can be read in such a way a fourth step 44 of the loop is executed in which a machine instruction is generated which corresponds to the particular preliminary instruction and which signals that restoration of the data is needed when the machine instruction is executed. The test of the third step 43 of the loop does not need to be complete: if it cannot be determined with certainty that no data can be read in the described way, a machine instruction which causes the data to be restored may be generated, even if it is not certain that data will be read in the described way, or if a better test might show that no data can be read in the described way.

The test of the third step 43 of the loop for selection of restoring/not-restoring instructions can be improved by using information from the source program that gave rise to the preliminary instructions. Preferably, one determines whether a memory location is "read again" on the basis of program variables and program structure rather than on the basis of memory locations used for those variables. In addition one may use information about the scope of variables, or about indexed addressing limited to an array to be used in determining whether memory locations will be read again. (A local scope may be implemented using a data block pointed at by a base register; the "read again" condition can then be tested for that datablock without knowing the actual memory locations involved. An array may be marked "read" if any location in the array is read in an indexed manner).

The test of the third step 43 of the loop can be implemented simply by taking the next preliminary instruction and applying the following procedure to it a) If that preliminary instruction is the last in the list of preliminary instructions: report that no restore is necessary.

b) If that preliminary instruction is an unconditional jump instruction: recursively execute this procedure for the jump target.

c) If that preliminary instruction is a conditional jump: execute the procedure both for the next preliminary instruction and the jump target. If either execution reports that restore is necessary: report that restore is necessary, otherwise report that no restore is necessary.

d) If that preliminary instruction writes to the variable addressed by the particular preliminary instruction: report that no restore is necessary.

e) If that preliminary instruction reads from the variable addressed by the particular preliminary instruction report that restore is necessary.

f) If none of the above the preliminary instruction affects neither program control nor the memory location: in this case apply the steps from a) to the next preliminary instruction.

More sophisticated algorithms may be employed to improve the speed with which it is determined whether restoration is necessary. For example, one may partition the list in "chunks" of preliminary instructions that include no internal jump targets or jump instructions. For each chunk one makes a table of variables in read destructible memory. The entries of the table indicate whether the variables will be read again.

One starts with chunks that end at the end of program execution. For such a chunk the table is initially filled with entries that indicate that the variables will not be read again. Then one works backwards through the preliminary instructions of the chunk:

a) if the preliminary instruction reads data from a variable, check the entry for that variable indicates that data is read from it, and generate the machine instruction according to the entry. The changes the entry in the table for that variable to "read again"

b) if the preliminary instruction writes data to a variable change the entry for that location to "not read again".

For chunks that end with a (conditional) jump one initializes the table entry for a variable to "read again" if the table of any of the chunks to which the jump can go has an entry "read again" for that variable and to "not read again" otherwise. Then one works backwards through the chunk as before. Chunks that are part of loops are worked through twice: once to determine the table entries for the beginning of the chunk and subsequently once to generate the machine instructions.

For some operating system buffers, for example I/O buffers, it can be specified that they may be read only once which allows the use of non restoring reads. Information whether an instruction should have the restore bit RB set can also be provided by a programmer. For this purpose a computer language may be enriched with a construct that allows the programmer to indicate that a particular variable will not be used again after some instruction. This information can be used in the fourth step 43 of the flowchart of FIG. 4. Of course in assembly level programs, the decision whether to restore data in a memory location after writing may be left entirely to the programmer.

The flowchart of FIG. 4 may be executed using a compiler stored in a computer readable memory and executed on a general purpose computer, or on the computer of FIG. 1.

It is not necessary that the indication whether to restore the data is included immediately in the instruction that reads the data for the last time. One may include a restore bit with the data in the memory. In this case, the restore circuit 11 is constructed so that it restores the data only when the restore bit included with the data indicates that the data should be restored. The compiler determines which preliminary instruction is the beforelast preliminary instruction to read the data from a location, and generates for that beforelast instruction an instruction that resets the restore bit for that location. Other instructions that read the location leave the restore bit set. (In case the location is read only once after a write instruction for that location, the compiler causes the write instruction to reset the restore bit).

I claim:

1. A processing system comprising:

a memory of a type which loses data upon reading, a processing unit responsive to instructions of a first type and of a second type, each of which, when executed by the processing unit, causes the processing unit to read data from the memory, instructions of the first type causing the processing unit to restore the data in the memory after reading, instructions of the second type causing the processing unit not to restore the data in the memory after reading.

2. A processing system according to claim 1 wherein each instruction type which causes the processing unit to read data from the memory and restore the data in the memory after reading has a counterpart instruction type which does not cause the processing unit to restore the data in the memory after reading.

3. A processing system comprising:

a memory having at least one memory location of a type which loses data upon reading, a processing unit having instructions of a first type and of a second type, each of which, when executed, causes the processing unit to read data from the memory, instructions of the first type causing the processing unit to restore the data in the memory after reading, instructions of the second type causing the processing unit not to restore the data after reading, the processing unit being programmed with a program containing instructions, each instruction being of the first type if that instruction causes the processing unit to read data from a memory location which loses data upon reading and is at such a position in the program that it can be followed during execution by another instruction causing the processing unit to read data from that memory location, at least one instruction being of the second type and causing the processing unit to read data from a memory location which loses data upon reading, the at least one instruction being at such a position in the program that it cannot be followed by another instruction causing the processing unit to read data from that memory location during execution of the program.

4. A processing system according to claim 1, the memory containing a restore circuit, arranged to restore the data in response to a restore bit stored with the data.

5. A memory for use in a processing system according to claim 1, the memory containing a restore circuit and a restore enable input, the memory restoring data after reading if a restore enable signal is presented at the restore enable input.

6. A memory for use in a processing system according to claim 4.

7. A method of generating instructions for executing operations of a program for a processing system with a memory with locations which lose data upon reading, and a processing unit having a first and a second type of instruction for reading data from the memory, the processing unit restoring and not restoring the data in the memory when executing instructions of the first and of the second type respectively, the method comprising the steps of determining whether an operation in the program reads data from a memory location, determining whether the operation can be followed by another operation reading data from that memory during execution of the program, generating an instruction of the first type when the operation can be followed by such another operation, and generating an instruction of the second type when the operation cannot be followed by such another operation.

8. A method according to claim 7 comprising loading said machine instruction into a memory from which said processing system is able to read said machine instruction for execution of said machine instruction.

9. A compiler for generating programs for a processing system with a memory with locations which lose data upon reading, and a processing unit having a first and a second type of instruction for reading data from the memory, the processing unit restoring and not restoring the data in the memory when executing instructions of the first and of the second type respectively, the compiler comprising means for determining whether an operation in the program reads data from a memory location, determining whether the operation can be followed by another operation reading data from that memory during execution of the program, generating an instruction of the first type when the operation can be followed by such another operation, and generating an instruction of the second type when the operation cannot be followed by such another operation.

10. A compiler according to claim 9 stored in a machine readable memory.

11. A compiling machine comprising a machine readable memory according to claim 10.

12. A processing unit having instructions of a first type and of a second type, each of which, when executed, causes the processing unit to read the data in the memory, wherein the memory is of a type which loses data upon reading, instructions of the first type causing the processing unit to restore the data in the memory, instructions of the second type causing the processing unit not to restore the data.

13. A processing unit according to claim 12, wherein each instruction type which causes the processing unit to read data from the memory location and restore the data in the memory has a counterpart instruction type which causes the processing unit to does not to restore the data in the memory.

* * * * *